(12) United States Patent
Sakhare

(10) Patent No.: US 9,418,727 B2
(45) Date of Patent: Aug. 16, 2016

(54) FIVE TRANSISTOR SRAM CELL

(75) Inventor: Sushil Sudam Sakhare, Mumbai (IN)

(73) Assignee: Broadcom Corporation, Irvine, CA (US)

( * ) Notice: Subject to any disclaimer, the term of this patent is extended or adjusted under 35 U.S.C. 154(b) by 518 days.

(21) Appl. No.: 13/561,469

(22) Filed: Jul. 30, 2012

(65) Prior Publication Data

US 2014/0029333 A1  Jan. 30, 2014

(51) Int. Cl.
*G11C 11/00* (2006.01)
*G11C 11/412* (2006.01)
*G11C 11/419* (2006.01)

(52) U.S. Cl.
CPC .......... *G11C 11/412* (2013.01); *G11C 11/419* (2013.01); *G11C 11/4125* (2013.01)

(58) Field of Classification Search
CPC . G11C 11/412; G11C 11/4125; G11C 11/419
USPC .................. 365/185.18, 156, 185.11, 189.02, 365/189.03
See application file for complete search history.

(56) References Cited

U.S. PATENT DOCUMENTS

| | | | |
|---|---|---|---|
| 5,877,976 A * | 3/1999 | Lattimore et al. | ............... 365/63 |
| 5,894,434 A | 4/1999 | Tran | |
| 6,044,010 A | 3/2000 | Deschene | |
| 6,205,049 B1 | 3/2001 | Lien et al. | |
| 2004/0165414 A1 | 8/2004 | Kushida | |
| 2011/0103137 A1* | 5/2011 | Beat | ............................. 365/156 |

FOREIGN PATENT DOCUMENTS

| | | |
|---|---|---|
| JP | 2004-259352 A | 9/2004 |
| TW | 201118873 A | 6/2011 |

OTHER PUBLICATIONS

Office Action from the Korean Intellectual Property Office directed toward related Korean Application No. 10-2013-0089420, dated Oct. 14, 2014; 4 pages.
European Search Report for EP Patent Application No. 13003473.9, European Patent Office, The Hague, Netherlands, mailed on Dec. 3, 2013.
Office Action directed toward related Taiwanese Patent Application No. 102124884, dated Apr. 10, 2015; 6 pages.
English-language abstract of Taiwanese Patent Publication No. 201118873, published Jun. 6, 2011; 2 pages.
Office Action from the Korean Intellectual Property Office directed toward related Korean Application No. 10-2013-0089420, dated Apr. 27, 2015; 3 pages.
Tran, Hiep. "Demonstration of 5T SRAM and 6T Dual-Port RAM Cell Arrays," 1996 Symposium on VLSI Circuits Digest of Technical Papers, 1996; 2 pages.

* cited by examiner

*Primary Examiner* — Richard Elms
*Assistant Examiner* — Mohammed A Basher
(74) *Attorney, Agent, or Firm* — Sterne, Kessler, Goldstein & Fox P.L.L.C.

(57) ABSTRACT

A five transistor static random-access-memory (SRAM) cell is disclosed which can be made part of an SRAM array to provide an improved reduction in size. The cell includes two cross-coupled inverters, each having two complementary transistors, and an n-channel transistor switch connected to a bit line (BL) and a word line (WL). The p-channel element of one of the inverters is connected to a power supply, and the p-channel transistor of the other inverter is coupled to a write bit line (WBL). By varying the voltage levels on the BL and WBL lines the biasing of the individual n-channel transistors of each of the inverters can be changed based on the data to be written to the cell. Various biasing systems are presented such that the SRAM cell memory state can be changed without requiring larger transistor elements to overpower the cell state.

21 Claims, 8 Drawing Sheets

FIVE TRANSISTOR SRAM CELL

BACKGROUND

1. Field of Disclosure

The disclosure relates to a static random-access (SRAM) cell and, more specifically, to a five-transistor SRAM cell.

2. Related Art

A random-access-memory (RAM) cell is a semiconductor memory which stores information as a single bit value. A static random-access-memory (SRAM) cell is a type of RAM cell that stores a bit value using bistable latching circuitry which is formed from a pair of cross-coupled inverters. The bistable latching circuitry is comprised of four transistors, but additional transistors, known as access transistors, are required for the memory controller to access to the SRAM cell to read the content of the cell and to write data to the cell.

SRAM cells can be connected together to form an array. In a world of ever-shrinking modern electronics, SRAM arrays are advantageous in that a larger amount of SRAM can be provided in a smaller physical space compared to SRAM cells operating independently in isolation. An SRAM array is generally designed using a number of individual SRAM cells connected in a grid pattern, with an individual SRAM cell accessed as part of an addressable row and column system. A memory controller together with memory driver circuitry can read and/or write to the SRAM array in a random fashion, as any particular cell value can be accessed at any particular time given the address of the row and column associated with an individual SRAM cell.

Because of the ability of the SRAM cell to hold a bit value, changing the cell bit value can involve various processes intended to "overpower" the state of some of the latching circuitry transistors over others utilizing the access transistors. The additional power handling required to overpower the access transistors results in an undesirable increase in size. The additional access transistors and the increased access transistor sizes places limitations on further reductions of the physical size of an SRAM array.

BRIEF DESCRIPTION OF THE DRAWINGS/FIGURES

Figure 1:
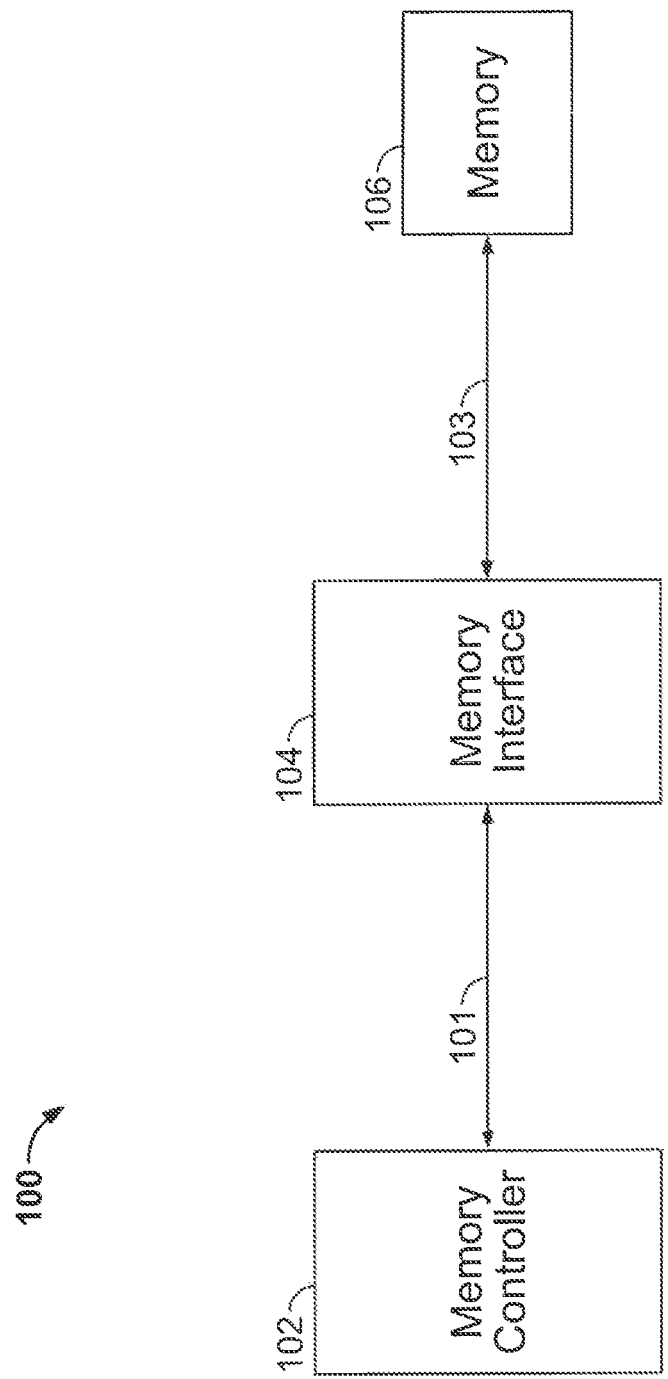
FIG. 1 illustrates a block diagram of a memory module according to an exemplary embodiment of the disclosure.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Unless otherwise indicated, the drawings provided throughout the disclosure should not be interpreted as to-scale drawings. More specifically, the timing diagrams may be exaggerated and/or non-continuous to provide a better description of the exemplary embodiments. Such exaggerations and/or non-continuities may further vary between axes, steps, and/or individual elements to more clearly demonstrate the concepts of the exemplary embodiments.

The logic levels and/or the default voltage states are provided for exemplary purposes only. Those skilled in the art will appreciate that logic levels can be reversed such that transistors are asserted using an active-low or an active-high logic scheme. Similarly, default, pull-up, and/or pull-down voltage states can be modified to accommodate the appropriate logic implementation. Transitions of data lines from one state to another should not be interpreted as an implication that the previous state was a default, standard, static, and/or an unchanging state.

Although the description of the present disclosure is to be described in terms of SRAM, those skilled in the relevant art(s) will recognize that the present disclosure can be applicable to other types of memory without departing from the spirit and scope of the present disclosure. For example, although the present disclosure is to be described using an SRAM memory controller and SRAM memory drivers, those skilled in the relevant art(s) will recognize that functions of these SRAM memory devices can be applicable to other memory devices that use additional types of memory such as DRAM, or non-volatile memory, without departing from the spirit and scope of the present disclosure.

An Exemplary Memory Interface

FIG. 1 illustrates a block diagram of a memory module according to an exemplary embodiment of the disclosure. Memory module 100 includes a memory controller 102, a memory interface 104, and a memory 106. The memory controller 102 can include a processor, a CPU, an application specific integrated circuit (ASIC), or a priority controller, for example. The memory interface 104 can include decoder circuitry, memory drivers, buffers, and/or latches, for example, configured to address, access, write, and/or read data to and from the memory 106. The memory interface 104 communicates with the memory controller 102 through memory bus 101. The functionality of any, some, or all of the memory interface 104 can be integrated as a part of the memory controller 102, for example, to facilitate the direct communication and control of the memory 106 from the memory controller 102.

The memory interface 104 interfaces with the memory 106 using control lines 103. The memory interface 104 can drive the control lines 103 to various voltage levels based on communications with the memory controller 102. The memory controller 102 and/or the memory interface 104 can change the voltage levels of any, some, or all of the control lines 103 with respect to one another dynamically, or keep any, some, or all of the control lines 103 a static, unchanged value for any duration of time. The state of the voltage levels on the control lines 103 allows the memory controller 102 to read data from the memory 106 and to write data to the memory 106.

An Exemplary Five-Transistor SRAM Cell

Figure 2:
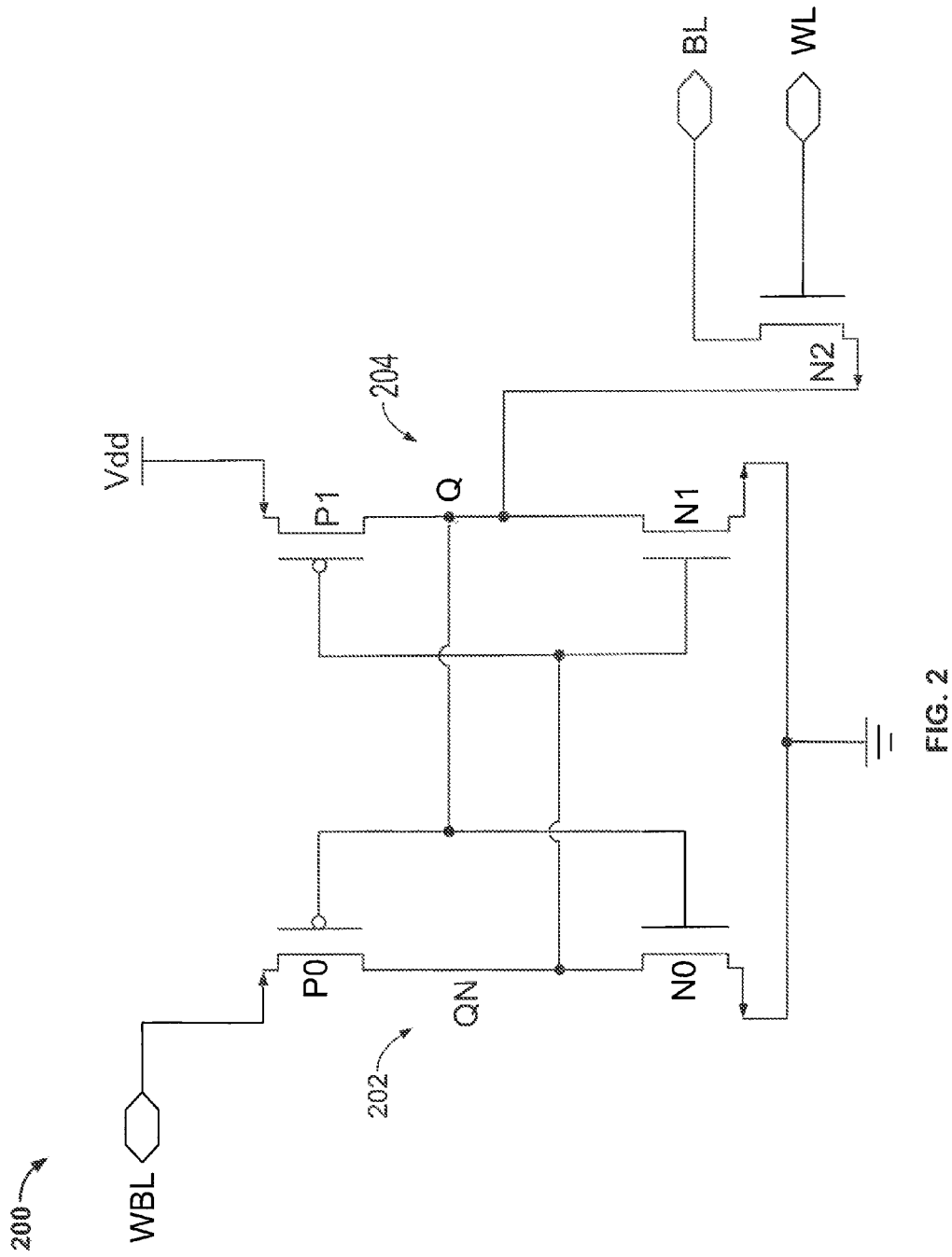
FIG. 2 illustrates a schematic diagram of a five-transistor SRAM cell according to an exemplary embodiment of the disclosure.

FIG. 2 illustrates a schematic diagram of a five-transistor semiconductor SRAM cell according to an exemplary embodiment of the disclosure. A five-transistor SRAM cell 200 is formed from a pair of cross-coupled inverters 202, 204, and an access switch represented by a single n-channel access transistor N2. Individual SRAM cell 200 can represent an exemplary embodiment of the memory 106. Inverter 202 comprises a p-channel transistor P0 and an n-channel transistor N0, with an input node Q and an output node QN. Inverter 204 comprises a p-channel transistor P1 and an n-channel transistor N1 with an input node QN and an output node Q. Access transistor N2 controls access to the node Q to read a data bit represented by the voltage level of node Q and to write a data bit to node Q. Although the transistors illustrated in FIG. 2 are represented as MOSFET transistors, it should be noted that the disclosure is not so limiting. The SRAM cell 200 can be implemented using various types of transistors or any other type of switching device that will be apparent to those skilled in the relevant art(s) without departing from the spirit and scope of the disclosure.

Access transistor N2 is connected to a bit line (BL) and a word line (WL). The word line is asserted in order to read the Q data bit, transferring the voltage at node Q to the BL, or to write a Q data bit, transferring the voltage of the BL to node Q. Transistor P0 is connected to a write bit line (WBL), which is used in conjunction with the WL and the BL to perform a write operation. The BL, the WL, and the WBL can represent an exemplary embodiment of the control lines 103.

Transistor P0 conducts when the gate voltage at node Q is a low voltage, such as a logic zero, for example, thereby substantially transferring the voltage of the WBL to node QN, providing that the WBL is a sufficiently high voltage, such as Vdd, a logic one, or a value deviating from Vdd, for example, to allow a drain-source current to flow through P0. Transistor P1 conducts when the gate voltage at node QN is a low voltage, such as a logic zero, for example, thereby substantially transferring the power supply voltage Vdd to node Q. Transistor N0 conducts when a positive gate voltage Q is applied to the gate thereby discharging the node QN to ground (logic zero). Transistor N1 conducts when a positive gate voltage at node QN is applied to the gate thereby discharging the Q node to ground (logic zero).

Access transistor N2 is connected to node Q and the Q data bit is read when the WL is asserted, as the node Q voltage is transferred to the BL. When the WL is asserted, access transistor N2 conducts, transferring the BL voltage to node Q to write a data bit. For example, the memory controller 102 can configure the BL as an input to the memory interface 104 when reading the Q data bit, and as an output from the memory interface 104 when the memory controller 102 is writing a Q data bit. The memory interface 104 can be configured, to provide an example, as a bidirectional buffer circuit.

The WBL can be driven independently of the BL and the WL. More specifically, the WBL can be held at a high voltage level, such as a logic one, for example, that is substantially static for read operations. The WBL can also be held at a high voltage level, such as a logic one, for example, when the SRAM cell 200 is in a "hold" state whereby data is not being read from or written to the SRAM cell 200. Furthermore, the WBL can be driven to a voltage level that deviates from a high voltage level, such as a logic one or Vdd, for example, when the memory controller 102 is performing a write operation.

The SRAM cell 200, the memory controller 102, and/or the memory interface 104 can be implemented as part of a single integrated circuit (IC), a semiconductor die, a chip, and/or integrated as a part of printed circuit board (PCB) design, to provide some examples. Furthermore, any, some, or all of the SRAM cell 200, the memory controller 102 and/or the memory interface 104 can be implemented as separate and/or external components relative to one another.

Although the Q and QN data bits are described as digital values, it should be noted that transient states can exist in which the values of nodes Q and QN will vary between logic high and logic low values, during state transitioning, for example. The voltage levels at nodes Q and/or QN can also deviate from the power supply Vdd (logic high) and ground (logic low) to voltage levels inside and outside the boundaries of the logic level voltages. Furthermore, although the SRAM cell 200 is a digital memory storage system, the voltage levels of the WBL, the BL, the WL, and/or Vdd can be analog values. Any, some, or all of the WBL, the BL, the WL, and/or Vdd can be varied, pulsed, strobed, and/or held constant.

An Exemplary Read Operation Timing Diagram

Figure 3A:
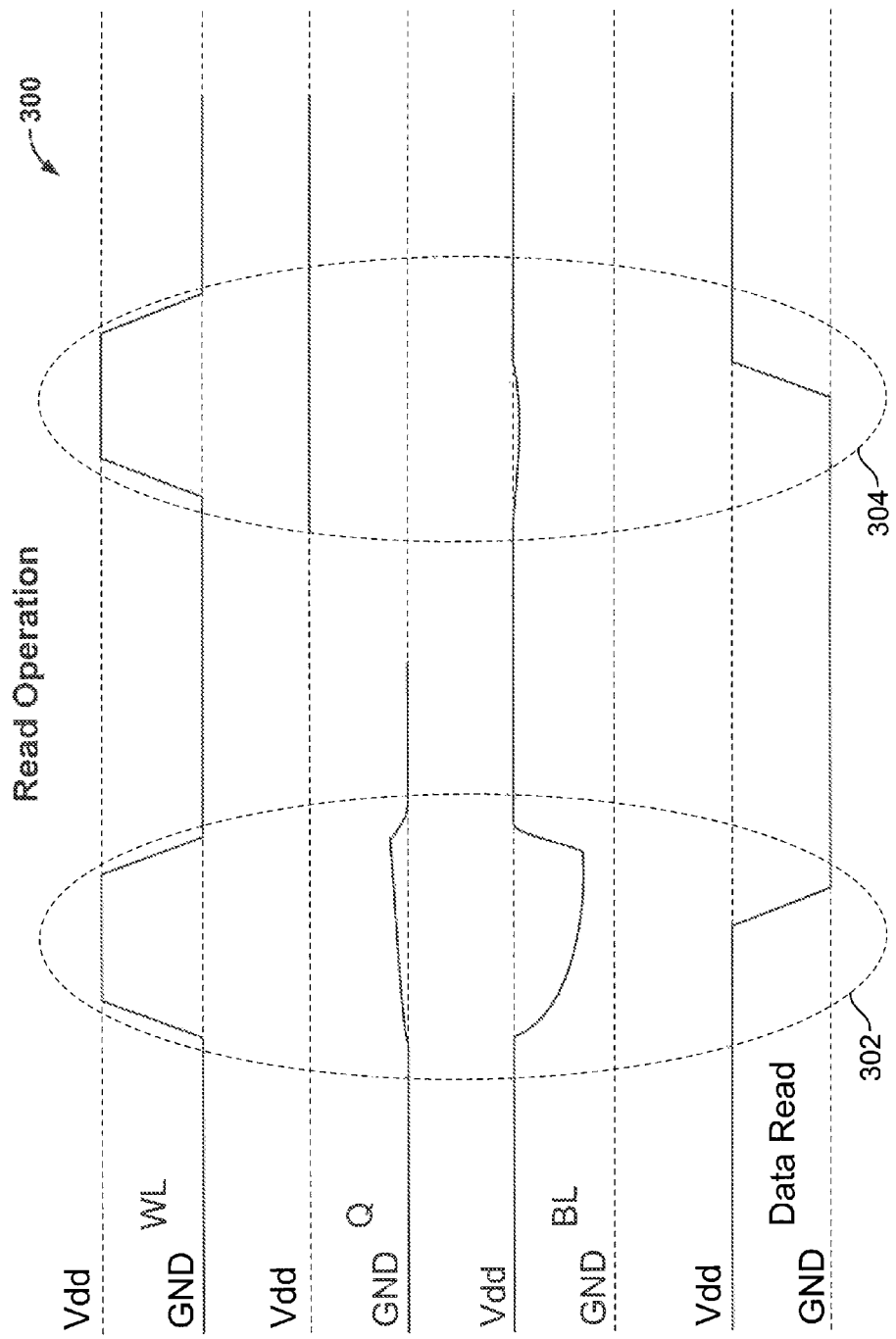
FIG. 3A illustrates a timing diagram to perform read operations from the five-transistor SRAM cell according to an exemplary embodiment of the disclosure.

FIG. 3A illustrates a timing diagram to perform read operations from the five-transistor SRAM cell according to an exemplary embodiment of the disclosure. Timing diagram 300 illustrates the timing of various voltage levels to perform a read operation from the SRAM cell 200. With reference to FIG. 2, the WL, Q data, and the BL voltage levels are shown. The WBL line is not illustrated in FIG. 3A because the state of the WBL can be held at a substantially constant value, such as a logic one, for example, so as to not influence the state of the SRAM cell 200 during a read operation. More specifically, as long as the voltage of the WBL remains above the threshold voltage of transistor N1 and does not drop to a level low enough such that P0 can no longer conduct due to the lack of drain-source current flowing through P0, the state of the SRAM cell 200 will remain stable during a read operation. To provide an example, the WBL can be set to a default voltage level by the memory controller 102 and/or the memory interface 104 such that an adequate drain-source current is provided at P0 when a low voltage, such as a logic zero, for example, is provided at the gate of P0.

Data read step 302 illustrates the timing and voltage levels corresponding to the SRAM cell 200 having a Q data bit logic value of zero. In data read step 302 the BL line is precharged to Vdd and the WL is driven to a high value, such as a logic one, for example, which turns on access transistor N2 for a period of time. During the time frame that the access transistor N2 is turned on, the BL is discharged through N2 and N1 to ground, as indicated in FIG. 3A by the approximated exponential decay of the precharged voltage at BL. After the memory controller 102 completes the data read step, the BL is precharged to Vdd in anticipation of the next data read. During the brief period of time that the BL discharges, the Q value increases slightly due to the increased voltage introduced by the precharged BL voltage, before falling back to ground.

The "data read" line is representative of the data value of the SRAM cell 200 read by the memory controller 102 during data read step 302. Although the BL value can discharge in a manner such that it never reaches ground, the memory controller 102 and/or the SRAM cell 200 can be configured to provide sufficient time to allow the BL to adequately discharge to a threshold value representative of a logic zero, to provide an example. To provide an additional example, a sense amplifier can be used to detect the difference in the Q data bit value and a reference value, thereby hastening the ability of the memory controller 102 to detect the Q data bit value. The data read operation is indicated by the transition in the "data read" line from a logic one (Vdd) to logic zero (GND).

Data read step 304 illustrates the timing and voltage levels corresponding to the SRAM cell 200 having a Q logic value of one. In this case, the WL is again driven to a high value and the BL is precharged to Vdd. However, as the BL is already charged to Vdd and P1 is conducting, the BL briefly fluctuates to a slightly lower voltage level indicative of the additional impedance introduced by turning on N2, temporarily reducing the current sourced by Vdd through the combination of P1 and N2. The "data read" line reflects the SRAM cell 200 value of one as illustrated by the transition from a logic zero to a logic one.

An Exemplary Write Operation Timing Diagram

Figure 3B:
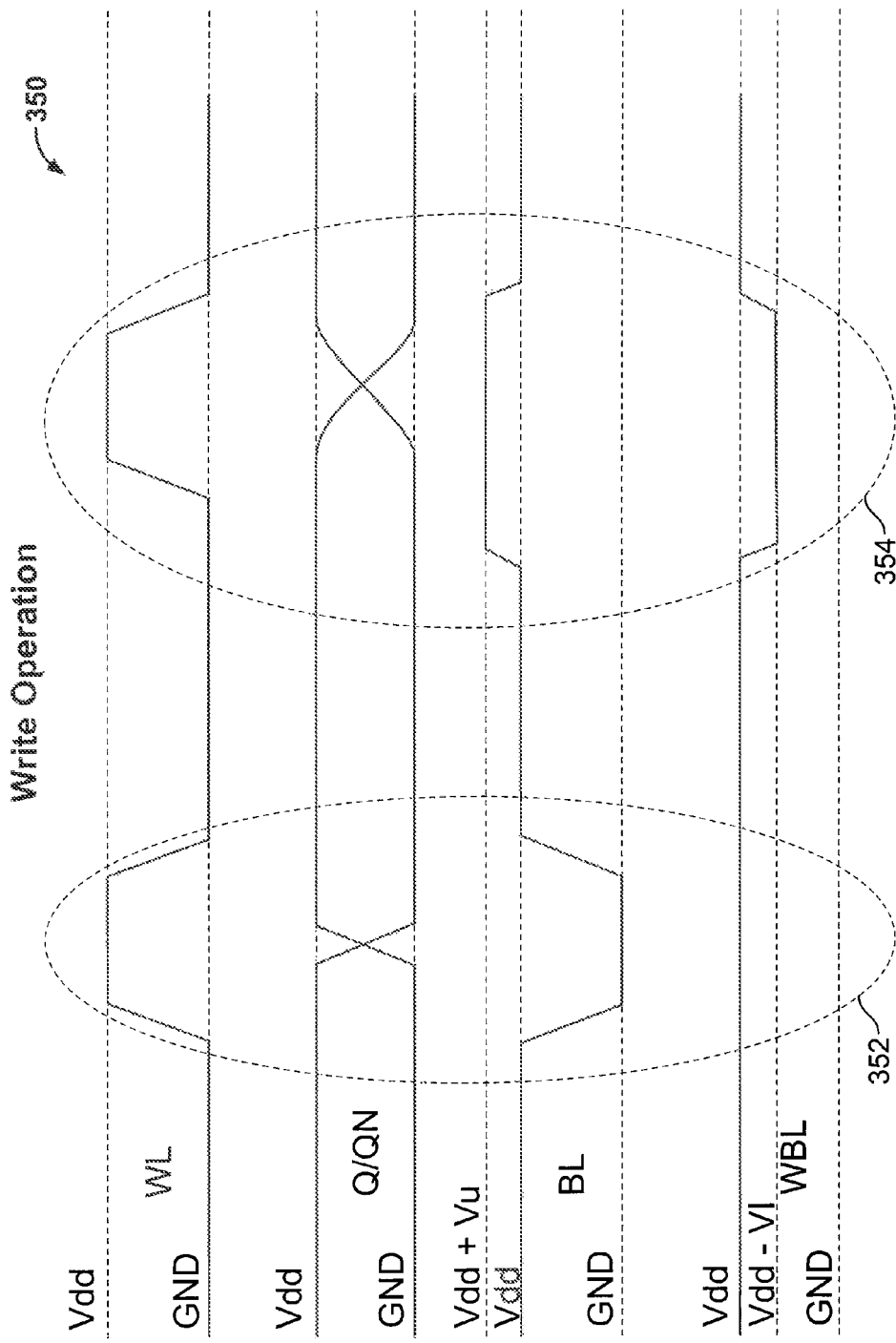
FIG. 3B illustrates a timing diagram to perform write operations to the five-transistor SRAM cell according to an exemplary embodiment of the disclosure.

FIG. 3B illustrates a timing diagram to perform write operations to the five-transistor SRAM cell according to an exemplary embodiment of the disclosure. Timing diagram 350 illustrates the timing of various voltage levels in order to write data to the SRAM cell 200. With reference to FIG. 2, the WL, Q/QN data, the BL, and the WBL voltage levels are shown.

Data write step 352 illustrates the timing and voltage levels corresponding to the memory controller 102 writing a zero to an SRAM cell 200. During data write step 352, the WL is driven to turn on N2. Assuming that the prior data value stored in the SRAM cell 200 was a one, transistors P1 and N0 are turned on before the data write step 352, and transistors P0 and N1 are turned off before the data write step 352.

To overwrite the logic value of one stored in the SRAM cell 200 with a logic value of zero, the BL is driven to a low voltage, such as a logic zero, for example, while asserting the WL. In order to write a logic zero into the SRAM cell 200, the value at the Q node must drop until transistor N0 turns off and transistor P0 turns on. Therefore, during the data write step 352, transistors P1 and N2 are in contention, as transistor P1 is conducting, pulling the voltage of the Q node up to Vdd, and N2 is conducting, pulling the voltage of the Q node down to the BL voltage. Because carrier mobility in an n-channel transistor is greater than that of a p-channel transistor, the voltage at node Q will drop until transistor N0 turns off. Provided that the voltage of the WBL is a sufficiently high voltage, such as a logic one, for example, as illustrated in FIG. 3B, the WBL voltage will be transferred to the QN node as P0 turns on, turning on N1 and forcing the Q node to a low voltage, such as logic zero or ground, for example.

Data write step 354 illustrates the timing and voltage levels corresponding to the memory controller 102 writing a one to the SRAM cell 200. During data write step 354, the WL is driven to turn on N2. Assuming that the prior data value stored in the SRAM cell 200 was a zero, transistors P0 and N1 are turned on before the data write step 354, and transistors P1 and N0 are turned off before the data write step 354.

To overwrite the logic value of zero stored in the SRAM cell 200 with a logic value of one, the BL is driven to a high voltage, such as a logic one, for example, while asserting the WL. In order to write a logic one into the SRAM cell 200, the value at the Q node must increase until transistor N0 turns on and transistor N1 turns off. Therefore, during the data write step 354, transistors N1 and N2 are in contention, as transistor N1 is conducting, pulling the voltage of the Q node down to ground, and N2 is conducting, pulling the voltage of the Q node up to the BL voltage. Both n-channel transistors N0 and N1 can sink and source approximately the same current when both are similar sizes. Increasing the size of one n-channel transistor is undesirable because this leads to an increase in the overall size of the SRAM cell 200. Therefore, transistors N0 and N1 are biased with different gate-to-source voltages to facilitate the data write step 354.

In order to vary the biasing of the transistors N0 and N1, the BL and the WBL voltage levels are driven to different voltage levels deviating from Vdd prior to the assertion of the WL as a pre-write step. The BL is driven to a voltage level exceeding Vdd by a voltage Vu. When the WL is asserted in data write step 354, an increased BL voltage level Vdd+Vu is provided at the gate of transistor N0. This increase in the gate-to-source voltage at transistor N0 strengthens the biasing of transistor N0.

The voltage Vu also controls the speed in which data can be written to the SRAM cell 200, allowing the state of data in the cell to be changed utilizing a faster write step 354 with the higher voltage level Vdd+Vu. The voltage Vu can vary from 0 volts to a voltage limitation which is a function of the transistor specifications of the SRAM cell 200. More specifically, the voltage Vdd+Vu has an upper limit imposed by the maximum voltage handling capabilities of the transistors in the SRAM cell 200.

Together with the increase in the BL voltage level, the WBL voltage level is also reduced prior to the assertion of the WL. Since transistor P0 is turned on when the Q node is zero, a decreased voltage level Vdd−Vl is provided at the gate of transistor N1, weakening the biasing of transistor N1. The voltage Vl is a function of the size of transistor P1 which affects the voltage at the node QN. In other words, the voltage Vdd−Vl has a lower limit which is the threshold voltage required to turn on transistor N1. Therefore, when the WL is asserted, the transistors N0 and N1 are advantageously biased unequally to allow the stronger biased transistor N0 to more easily conduct to ground and to force the QN node to zero. When the QN node is forced to zero, transistor P1 conducts, and the SRAM cell stabilizes with Q set to one.

An Exemplary Five-Transistor SRAM Cell Array

Figure 4:
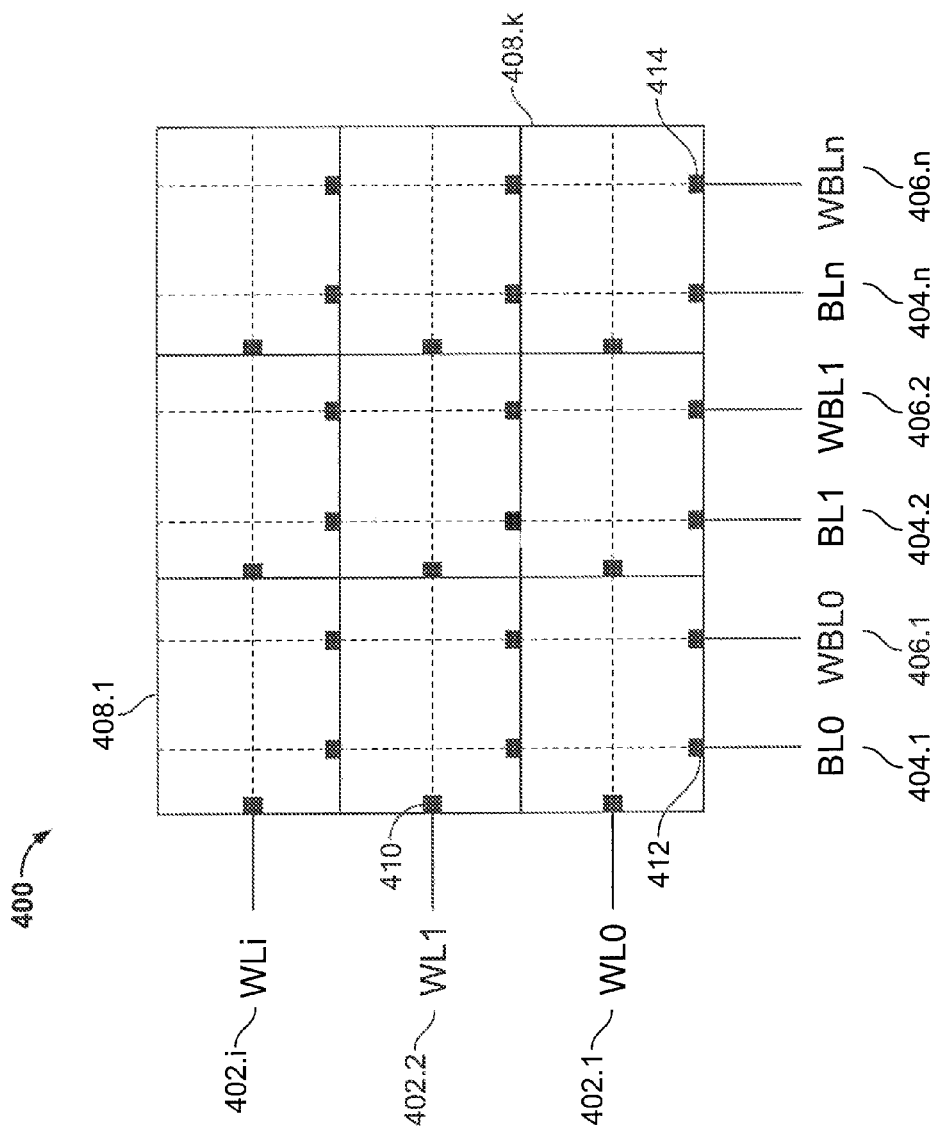
FIG. 4 illustrates a schematic diagram of an array of five-transistor SRAM cells according to an exemplary embodiment of the disclosure.

FIG. 4 illustrates a schematic diagram of an array of five-transistor SRAM cells according to an exemplary embodiment of the disclosure. SRAM cell array 400 includes a connected grid pattern of individual SRAM cells 408, represented as 408.1 through 408.k, where k represents the number of SRAM cells in the SRAM cell array 400. Individual SRAM cells 408.1 through 408.k can each represent an exemplary embodiment of the SRAM cell 200. Although FIG. 4 illustrates the SRAM cell array 400 as a 3×3 array of SRAM cells 408.k, the actual realization of SRAM cell array 400 would ordinarily be orders of magnitude greater than the 9-bit capacity represented in FIG. 4.

Each of the SRAM cells 408.1 through 408.k of the SRAM cell array 400 is connected to a common word line (WL) 402.1 through 402.i, as well as a common bit line (BL) 404.1 through 404.n and a common write bit line (WBL) 406.1 through 406.n. The word lines 402.1 through 402.i connect SRAM cells 408.1 through 408.k which share a row as indicated by connection point 410. The total number of word lines for a given SRAM cell array 400 is represented by WL0 through WLi, where i represents the number of rows in the SRAM cell array 400. Similarly, the bit lines 404.1 through 404.n connect SRAM cells 408.1 through 408.k which share an entire column as indicated by connection point 412, and the write bit lines 406.1 through 406.n also connect SRAM cells 408.1 through 408.k which share an entire column as indicated by connection point 414. The total number of bit lines and write bit lines for a given SRAM cell array 400 is represented by BL0 and WBL0 through BLn and WBLn, where n represents the number of columns in the SRAM cell array 400. Although the word lines 402.1 through 402.i, bit lines 404.1 through 404.n, and write bit lines 408.1 through 408.k cross over one another to connect respective rows and columns of the SRAM cell array 400, the word lines 402.1 through 402.i, bit lines 404.1 through 404.n, and write bit lines 406.1 through 406.n do not connect to one another, as indicated by the broken lines in FIG. 4.

In order to access a particular SRAM cell 408 of the SRAM cell array 400, the memory controller 102 and/or the memory interface 104 can be configured to access a specific SRAM cell 408 corresponding to the address of the SRAM cell 408. To provide an example, the memory controller 102 can access the center SRAM cell 408 by driving the WL1, the BL1, and the WBL1 accordingly. More specifically, the memory controller 102 can drive the WL1, the BL1, and/or the WBL1 lines according to FIGS. 3A-3B associated with the desired read or write function.

In order to read the center SRAM cell 408, the WBL1 line can remain at a high voltage level, such as a logic one, for example, as this does not affect the state of any of the cells in SRAM cell array 400. Then, the BL1 line is precharged to a high voltage level, such as a logic one, for example, and the WL1 line is driven to read the data in the center SRAM cell 408.

In order to write to the center SRAM cell 408, the WL1, the BL1, and the WBL1 lines are driven according to FIG. 3B. Writing to a single SRAM cell 408 does not affect the state of the other SRAM cells 408 in the SRAM cell array 400. When a logic one is to be written to the center SRAM cell 408 having a stored value of zero, the BL1 line is increased to Vdd+Vu and the WBL1 line is decreased to Vdd−Vl. Referring back to FIG. 2, as long as the voltage of the WBL1 keeps node QN above the threshold voltage of transistor N1 and does not drop to a level low enough for P1 to conduct, the SRAM cells 408 of the SRAM cell array 400 will remain in an unchanged state. Increasing the voltage on BL1 does not affect the other cells 408 because the voltage on BL1 is only transferred to an SRAM cell 408 when WL1 is also asserted.

An Exemplary Static Noise Margin Diagram

Figure 5:
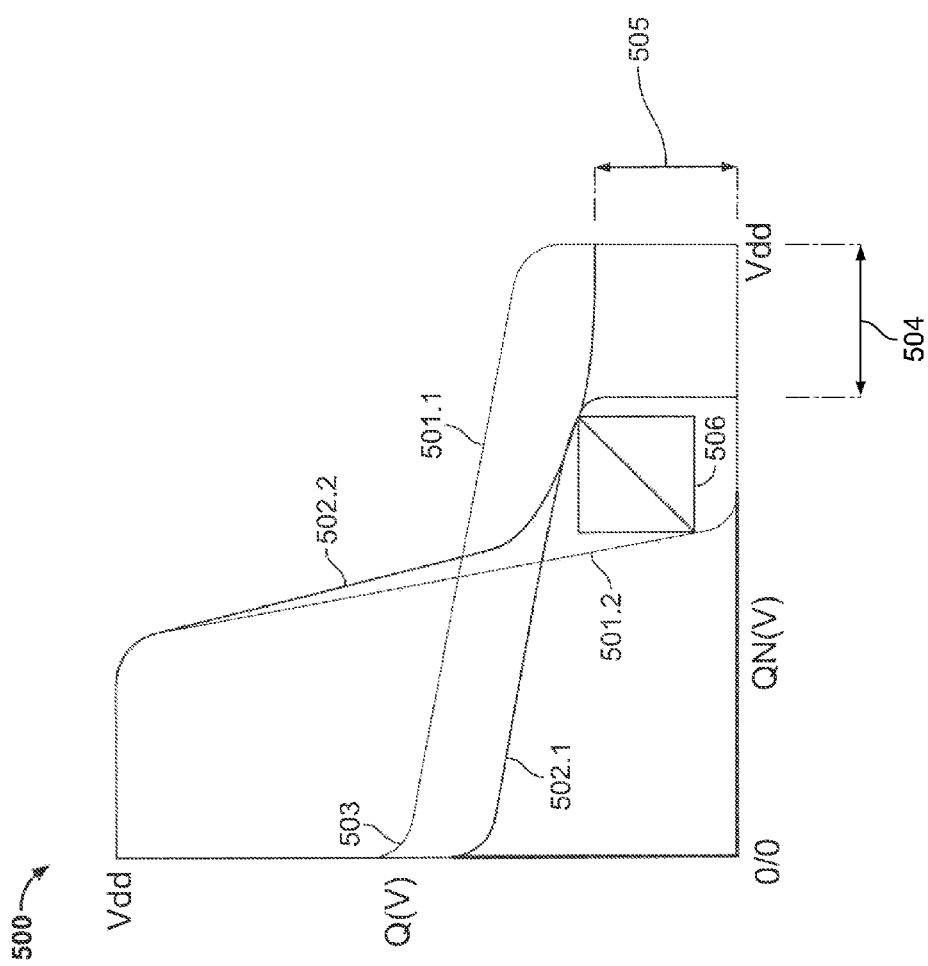
FIG. 5 illustrates a graphical representation of a static noise margin (SNM) of the SRAM cell according to an exemplary embodiment of the disclosure.

FIG. 5 illustrates a graphical representation of a static noise margin (SNM) of the SRAM cell according to an exemplary embodiment of the disclosure. SNM is a measure of the amount of voltage noise the SRAM cell 200 can withstand at nodes Q and QN before the hold state of the voltages at Q and QN "flip," or change states. SNM graph 500 illustrates two sets of voltage transfer curves, each corresponding to an inverter of the SRAM cell 200. Voltage transfer curve 501.1 corresponds to the voltage transfer curve of inverter 202, and voltage transfer curve 501.2 corresponds to the voltage transfer curve of inverter 204. More specifically, voltage transfer curve 501.1 indicates the output voltage of node QN by varying the input voltage of node Q. Likewise, voltage transfer curve 501.2 indicates the output voltage of node Q by varying the input voltage of node QN.

For example, assuming that the voltage of node QN is initially at zero and the voltage of node Q is at Vdd, the voltage of node QN will remain at zero until the voltage of node Q decreases enough to turn off N0 and turn on P0, indicated by the transition point 503. When N0 is turned off and P0 is turned on, the voltage of node QN follows the transfer curve 501.1. Similarly, assuming that the voltage of node Q is initially at Vdd and the voltage of node QN is zero, the voltage of node Q will remain at Vdd until the voltage of node QN increases enough to turn off P1 and turn on N1. When P1 is turned off and N1 is turned on, the voltage of node Q follows the transfer curve 501.2.

The SNM is quantified in FIG. 5 by the length of the diagonal line connecting the corners of SNM box 506. Referring back to FIG. 4, as a high voltage level, such as a logic one, for example, is written to the center SRAM cell 408, the SNM box 506 represents the SNM of other cells sharing the same column in the array 400. More specifically, if a high voltage level, such as a logic one, for example, is written to the center SRAM cell 408, all cells 408 that share the BL1 and the WBL1, but are not being written to, will exhibit an SNM indicated by the SNM box 506 while the write step 354 is taking place.

When writing a high voltage, such as a logic one, for example, to node Q of the center SRAM cell 408, the WBL1 is driven to a voltage less than Vdd, such as Vdd−V1, for example, and the BL1 is driven to a voltage higher than Vdd, such as Vdd+Vu, for example. Therefore, because each inverter of the SRAM cells 408 that are connected to WBL1 and BL1 are supplied with an unequal voltage at their corresponding P0 and P1 transistors, the transfer curves 501.1 and 501.2 become skewed during a logic one write operation for those cells 408 that are not being written to. More specifically, the transfer curve 501.1 is illustrated in bold as transfer curve 502.1 during a logic one write operation, and is shifted from transfer curve 501.1 by a voltage Vdd−V1 representing a decrease in voltage 504. Furthermore, the transfer curve 501.2 is illustrated in bold as transfer curve 502.2 during a logic one write operation is shifted by Vdd+Vu represented by an increase in voltage 505.

An Exemplary Six-Transistor Two Port SRAM Cell

Figure 6:
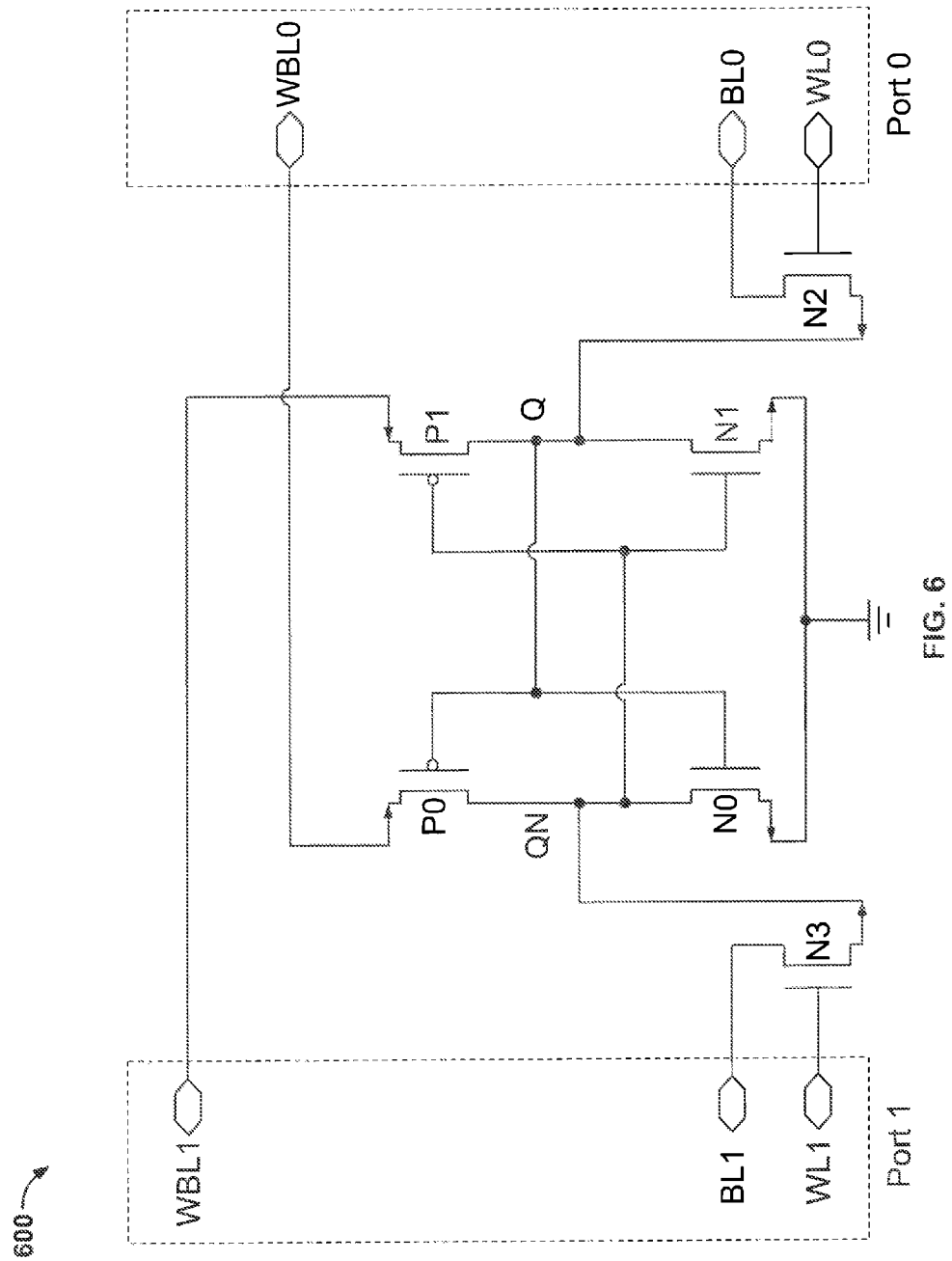
FIG. 6 illustrates a schematic diagram of a six-transistor two port bit-cell according to an exemplary embodiment of the disclosure.

FIG. 6 illustrates a schematic diagram of a six-transistor two port SRAM cell according to an exemplary embodiment of the disclosure. The two-port SRAM cell 600 has an architecture similar to the SRAM cell 200, with the transistors P0, P1, N0, and N1 storing the bit value at nodes Q and QN, with P0 and P1 each connected to a write bit line WBL0 and WBL1, respectively. Two-port SRAM cell 600 also has two n-channel access transistors N2 and N3, each connected to a respective bit line BL0, BL1 and a word line WL0 and WL1. The two-port SRAM cell 600 can also be arranged in an array, with twice as many word lines, bit lines, and write bit lines per cell of the array as compared to the SRAM cell array 400.

Two-port SRAM cell 600 allows two separate memory controllers, CPU's, and/or other devices requiring SRAM resources to access the Q and QN data bits independently or simultaneously. Although the bit values shared among two devices are complements of one another, this can be compensated with additional circuitry and a knowledge of the numbering scheme assigned to the layout of the ports. For example, all odd-numbered ports can be inverted to recover Q from QN.

The two ports of the two-port SRAM cell 600 can be identified as Port 0 and Port 1. Port 0 is associated with P0, N0, N1, and N2. Port 1 is associated with P1, N0, N1, and N3. During a read operation, the WBL0 and the WBL1 lines are unused and remain at a high voltage level. Port 0 and Port 1 can then access Q and QN, respectively, according to the timing diagram associated with the read operations for the SRAM cell 200 as illustrated in FIG. 3A. Because BL0 and BL1 are connected to separate data nodes Q and QN, the precharged BL values will not influence the state of the two port SRAM cell 600 when performing simultaneous read operations.

During a write operations, Port 0 and Port 1 can separately write data to the two-port SRAM cell 600 as illustrated in FIG. 3B using a priority memory controller, for example. When Port 0 writes a one into the two port SRAM cell 600, N0 will be more strongly biased than N1 due to the boosting of BL0 voltage and the reduction in the WBL0 voltage. Likewise, when Port 1 writes a one into the two-port SRAM cell 600, N1 will be more strongly biased than N0.

Although only one of the two ports P0 and P1 can write data to the two-port SRAM cell 600 at any given time, the write speed performance can be increased by taking advantage of the complementary nature of the Q and QN data. In other words, in most cases it will be faster to write a zero into the two-port SRAM cell 600 than it is to write a one, because of the additional charging required to unequally bias N2 and N3. Although the steps involved to write a zero or a one to the SRAM cell 200 as illustrated in FIG. 3B apply to both port 0 and port 1, port 0 writing a one to the Q node of the two-port SRAM cell 600 is equivalent to port 1 writing a zero to the QN mode of the two-port SRAM cell 600. The devices that share access to the two-port SRAM cell 600 can be configured to take advantage of this relationship by communicating the data to be written with one another. To speed up the writing time, some or all of the one writing steps can be replaced with complementary zero writing steps at the opposite port.

An Exemplary Eight-Transistor Four-Port SRAM Cell

Figure 7:
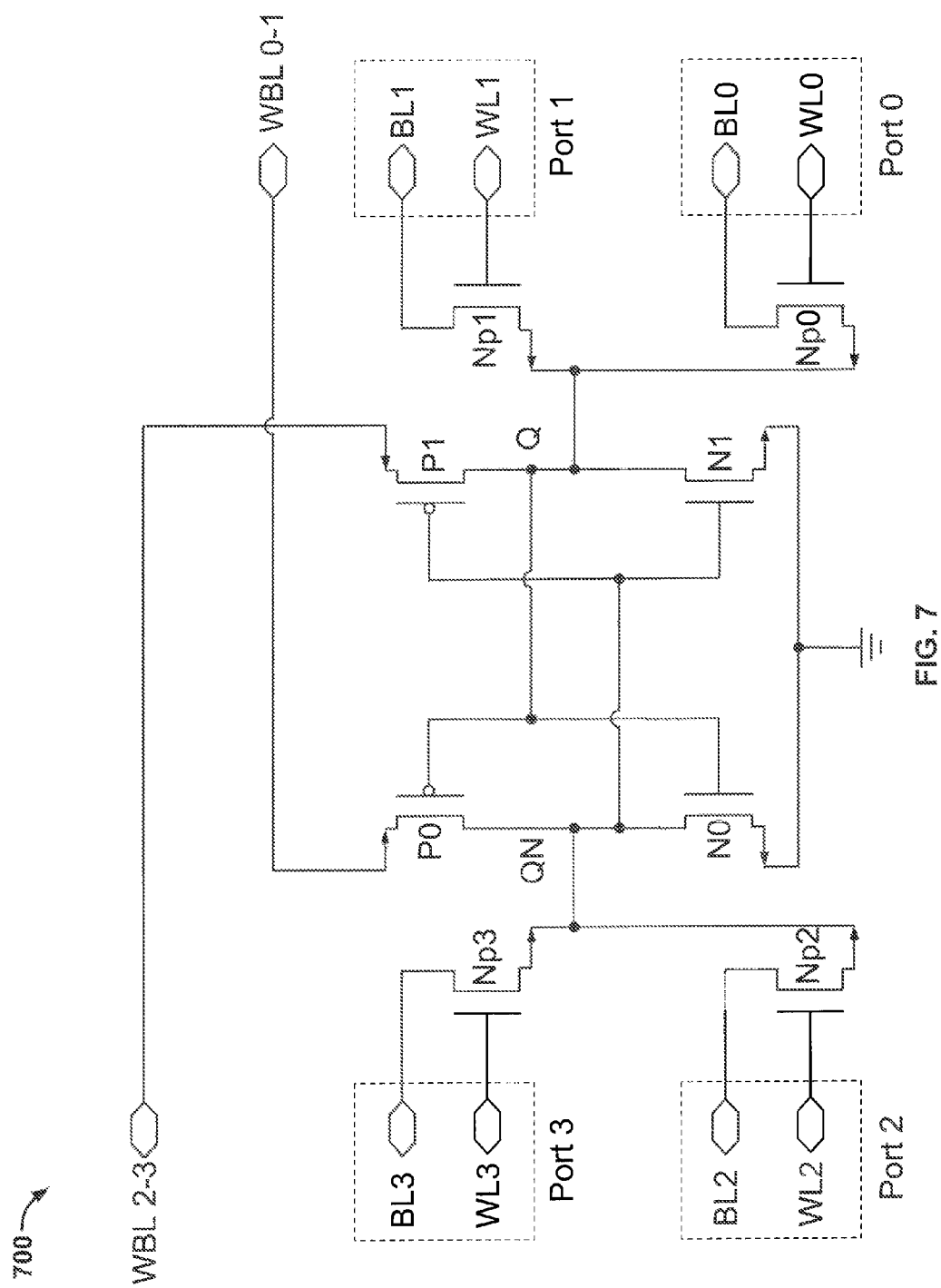
FIG. 7 illustrates a schematic diagram of an eight-transistor four port bit-cell according to an exemplary embodiment of the disclosure.

FIG. 7 illustrates a schematic diagram of an eight-transistor four port bit-cell according to an exemplary embodiment of the disclosure. The four-port SRAM cell 700 has an architecture similar to two-port SRAM cell 600, with the transistors P0, P1, N0, and N1 storing the data bits at nodes Q and QN, with P0 and P1 each connected to a write bit line WBL0-1 and WBL2-3, respectively. Four-port SRAM cell 700 also has four n-channel access transistors Np0, Np1, Np2, and Np3, each connected to a respective bit line BL0, BL1 and a word line WL0 and WL1. The four-port SRAM cell 700 can also be arranged in an array, with twice as many write bit lines and four times as many word lines and bit lines per cell of the array as compared to the SRAM cell array 400.

Four-port SRAM cell 700 allows four separate memory controllers, CPU's, and/or other devices requiring SRAM resources to access the stored bit values Q and QN independently or simultaneously in a similar fashion to the two-port SRAM cell 600.

The four ports of the four-port SRAM cell 700 can be identified as Port 0, Port 1, Port 2, and Port 3. Ports 0-1 are associated with P0, N0, N1, Np1, and Np2. Ports 2-3 are associated with P1, N0, N1, Np2, and Np3. The write bit lines WBL 0-1 and WBL2-3 are shared between ports 0-1 and ports 2-3, respectively. During a read operation, the WBL 0-1 and WBL 2-3 lines are unused and remain at a high voltage level, such as a logic one, for example. Ports 0-3 can then access Q and QN, respectively, according to the timing diagram associated with the read operations for the SRAM cell 200 as illustrated in FIG. 3A either simultaneously or independently. When all Ports 0-3 are simultaneously accessing the four port SRAM cell 700, BL0 through BL3 are all precharged to a high voltage, such as a logic one, for example, with BL0 and BL1 connected to the Q node and BL2 and BL3 connected to the QN node. Although the additional impedances can initially pull down a high Q or QN value, additional circuitry such as the memory controller 102 and/or the memory interface 104 can compensate for this effect to ensure data reliability.

During a write operation, Ports 0-3 can separately write data to the two-port SRAM cell 600 as illustrated in FIG. 3B using a priority memory controller, for example. When Port 0 or Port 1 writes a one into the four port SRAM cell 700, N0 will be more strongly biased that N1 due to the boosting the voltages of BL0 or BL1 and the reduction in the voltages of the WBL 0-1. Likewise, when Ports 2-3 write a one into the four-port SRAM cell 700, N1 will be more strongly biased than N0.

Although four ports are provided as illustrated in FIG. 7, the disclosure is not so limited. The concept of the four-port SRAM cell 700 can be expanded to implement any number of ports that can simultaneous access the Q and QN data that will be apparent to those skilled in the relevant art(s) without departing from the spirit and scope of the disclosure.

CONCLUSION

It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. A semiconductor memory, comprising:
   a first inverter and a second inverter cross-coupled to one another;
   an access switch coupled to an output of the first inverter;
   a first control line, coupled to the access switch, configured to be an output for a read operation and an input for a write operation; and
   a second control line directly coupled to the second inverter;
   wherein the first inverter and the second inverter are configured to be unequally biased in response to the first control line being driven above a reference voltage and the second control line being driven below the reference voltage.

2. The semiconductor memory of claim 1, wherein the access switch comprises:
   an access transistor.

3. The semiconductor memory of claim 2, wherein the first inverter and the second inverter each comprises:
   a first p-channel transistor and an n-channel transistor.

4. The semiconductor memory of claim 3, wherein the access transistor, the p-channel transistor and the n-channel transistor comprise:
   metal oxide semiconductor field-effect transistors (MOSFETs).

5. The semiconductor memory of claim 1, wherein the reference voltage comprises:
   a supply voltage of the semiconductor memory.

6. The semiconductor memory of claim 4, wherein the first control line comprises:
   a bit line (BL), and
   wherein the second control line comprises:
   a write-bit line (WBL).

7. The semiconductor memory of claim 6, further comprising:
   a third control line coupled to the access switch, wherein the third control line comprises:
   a word line (WL) configured to control a conducting mode of the access switch.

8. The semiconductor memory of claim 6, wherein the first inverter and the second inverter each comprises:
   a p-channel transistor and an n-channel transistor, and
   wherein the p-channel transistor of the first inverter or the second inverter is coupled to the WBL.

9. The semiconductor memory of claim 6, wherein the BL is driven above the reference voltage and the WBL is driven below the reference voltage substantially concurrently to facilitate a write operation.

10. A semiconductor memory, comprising:
    a first inverter and a second inverter cross-coupled to one another;
    wherein the first inverter includes a first p-channel transistor coupled to a power supply line and a first n-channel transistor,
    wherein the second inverter includes a second p-channel transistor directly coupled to a write-bit line (WBL) and a second n-channel transistor, and
    wherein the first p-channel transistor and the first n-channel transistor are coupled to an access transistor, the access transistor being coupled to a bit-line (BL), the BL being configured to be an output for a read operation and an input for a write operation.

11. The semiconductor memory of claim 10, wherein the first n-channel transistor and the second n-channel transistor are configured to be unequally biased in response to the WBL being driven below a power supply voltage received over the power supply line and the BL being driven above the power supply voltage.

12. The semiconductor memory of claim 10, further comprising:
    a third control line coupled to the access transistor,
    wherein the third control line comprises:
    a word line (WL) configured to control a conducting mode of the access transistor.

13. The semiconductor memory of claim 10, wherein the first n-channel transistor, the second n-channel transistor, the first p-channel transistor, the second p-channel transistor, and the access transistor comprise:
    metal oxide semiconductor field-effect transistors (MOSFETs).

14. The semiconductor memory of claim 10, wherein the WBL is driven below a power supply voltage received over the power supply line and the BL is driven above the power supply voltage substantially concurrently to facilitate a write operation.

15. A semiconductor memory, comprising:
    a first inverter and a second inverter cross-coupled to one another;
    a first port having a first plurality of control lines configured for a first read operation and a first write operation;
    a second port having a second plurality of control lines configured for a second read operation and a second write operation;
    wherein the first inverter includes a first p-channel transistor and a first n-channel transistor coupled to the first port,
    wherein the second inverter includes a second p-channel transistor and a second n-channel transistor coupled to the second port,
    wherein at least one control line from among the first plurality of control lines is directly coupled to the first p-channel transistor and at least one control line from among the second plurality of control lines is directly coupled to the second p-channel transistor, and
    wherein the first n-channel transistor and the second n-channel transistor are configured to be unequally biased in response to a portion of the first plurality of control lines being driven below a power supply voltage and the at least one control line from among the second plurality of control lines being driven above the power supply voltage.

16. The semiconductor memory of claim 15, wherein the first plurality of control lines comprises:
    a write bit line (WBL);
    a bit line (BL); and
    a word line (WL).

17. The semiconductor memory of claim 16, wherein the first port comprises:
  a first access transistor coupled to the first inverter, wherein the BL and the WL are coupled to the first access transistor, the WL being configured to control a conducting mode of the first access transistor, and wherein the second port comprises:
  a second access transistor coupled to the second inverter, wherein a second BL and a second WL are coupled to the second access transistor, the second WL being configured to control a conducting mode of the second access transistor.

18. The semiconductor memory of claim 16, wherein the WBL is driven below the power supply voltage and the BL is driven above the power supply voltage substantially concurrently to facilitate a write operation.

19. The semiconductor memory of claim 16, wherein the WBL is shared among the first and the second ports.

20. The semiconductor memory of claim 15, wherein the first and the second ports are configured to enable shared access to the semiconductor memory among a plurality of devices.

21. A semiconductor memory cell, consisting of:
  a first p-channel transistor and a first n-channel transistor forming a first inverter;
  a second p-channel transistor and a second n-channel transistor forming a second inverter, the first inverter and the second inverter being cross-coupled to one another;
  an access switch coupled to the first inverter;
  a write bit line (WBL) coupled to the second inverter; and
  a bit line (BL) and a word line (WL) coupled to the access switch.

* * * * *